US007943410B2

(12) United States Patent
Le Neel et al.

(10) Patent No.: US 7,943,410 B2
(45) Date of Patent: May 17, 2011

(54) EMBEDDED MICROELECTROMECHANICAL SYSTEMS (MEMS) SEMICONDUCTOR SUBSTRATE AND RELATED METHOD OF FORMING

(75) Inventors: Olivier Le Neel, Ang Mo Kio (SG); Peyman Sana, Frisco, TX (US); Loi Nguyen, Carrollton, TX (US); Venkatesh Mohanakrishnaswamy, Coppell, TX (US)

(73) Assignee: STMicroelectronics, Inc., Coppell, TX (US)

( * ) Notice: Subject to any disclaimer, the term of this patent is extended or adjusted under 35 U.S.C. 154(b) by 198 days.

(21) Appl. No.: 12/331,521

(22) Filed: Dec. 10, 2008

(65) Prior Publication Data

US 2010/0140724 A1 Jun. 10, 2010

(51) Int. Cl.
*H01L 21/00* (2006.01)
(52) U.S. Cl. ........ 438/50; 438/51; 438/52; 257/E21.499
(58) Field of Classification Search .................... 438/51, 438/52; 257/E21.499
See application file for complete search history.

(56) References Cited

U.S. PATENT DOCUMENTS

| 5,186,745 | A | 2/1993 | Maniar | 106/287.16 |
|---|---|---|---|---|
| 6,027,950 | A | 2/2000 | Harvey et al. | 438/14 |
| 6,069,392 | A * | 5/2000 | Tai et al. | 257/419 |
| 6,958,566 | B2 * | 10/2005 | Nguyen et al. | 310/321 |
| 7,022,542 | B2 * | 4/2006 | Combi et al. | 438/52 |
| 7,023,065 | B2 | 4/2006 | Ayazi et al. | 257/414 |
| 7,202,764 | B2 * | 4/2007 | Deligianni et al. | 335/78 |
| 7,256,107 | B2 | 8/2007 | Takeuchi et al. | 438/460 |
| 2006/0234412 | A1 | 10/2006 | Lazaroff | 438/48 |
| 2007/0281381 | A1 * | 12/2007 | Ayazi | 438/52 |
| 2008/0054759 | A1 * | 3/2008 | Ayazi et al. | 310/309 |
| 2008/0164542 | A1 * | 7/2008 | Yang et al. | 257/415 |
| 2009/0267166 | A1 * | 10/2009 | Verheijden et al. | 257/415 |
| 2009/0275163 | A1 * | 11/2009 | Lacey et al. | 438/51 |
| 2010/0052081 | A1 * | 3/2010 | Donkers et al. | 257/415 |

* cited by examiner

*Primary Examiner* — Walter L Lindsay, Jr.
*Assistant Examiner* — Ron Pompey
(74) *Attorney, Agent, or Firm* — Lisa K. Jorgenson; Christopher F. Regan

(57) ABSTRACT

An embedded MEMS semiconductor substrate is set forth and can be a starting material for subsequent semiconductor device processing. A MEMS device is formed in a semiconductor substrate, including at least one MEMS electrode and a buried silicon dioxide sacrificial layer has been applied for releasing the MEMS. A planarizing layer is applied over the substrate, MEMS device and MEMS electrode. A polysilicon protection layer is applied over the planarizing layer. A silicon nitride capping layer is applied over the polysilicon protection layer. A polsilicon seed layer is applied over the polysilicon nitride capping layer. The MEMS device is released by removing at least a portion of the buried silicon dioxide sacrificial layer and an epitaxial layer is grown over the polysilicon seed layer to be used for subsequent semiconductor wafer processing.

19 Claims, 8 Drawing Sheets

EMBEDDED MICROELECTROMECHANICAL SYSTEMS (MEMS) SEMICONDUCTOR SUBSTRATE AND RELATED METHOD OF FORMING

FIELD OF THE INVENTION

The present invention relates to microelectromechanical systems (MEMS), and more particularly, the present invention is related to semiconductor manufacturing techniques and MEMS.

BACKGROUND OF THE INVENTION

MEMS technologies could be classified in various technology families. One technology family is a pure MEMS and a second technology family is a MEMS plus integrated circuit (IC). New applications, needs and features for MEMS appear constantly. MEMS technology includes the nano-scale and nano-electromechanical systems and related nano technology. MEMS devices often are referred to as micromachines or micro system technology. Silicon is used to create not only the integrated circuits that might be used with MEMS devices, but silicon is also used for fabricating the MEMS devices themselves, since in single crystal form, silicon is an almost perfect Hookean material. When flexed, silicon has virtually no hysteresis and little energy dissipation, allowing repeatable motion of MEMS devices for multiple cycles. Different semiconductor layers are deposited and patterned using photolithography and etching techniques to produce the required MEMS shapes. Wet and dry etching are also often used.

Other technologies used when fabricating MEMS include Reactive Ion Etching (RIE) and Deep Reactive Ion Etching (DRIE) and various type of fluoride etching for releasing any metal and dielectric structures. Surface micro machining and high aspect ratio (HAR) micromachining are often used as MEMS fabrication techniques.

MEMS devices are often fabricated for inkjet printers that use piezoelectric or thermal bubble ejection, accelerometers, gyroscopes, silicon pressure sensors, displays, such as with DMD chips, optical switches and other switches and display technology applications.

Many of the MEMS applications use specific films, layers and sequences of processing that were developed for standard CMOS, BiCMOS, BCD (Bipolar-CMOS-DMOS) or NV (non-volatile) memory applications. Some of these applications are pure MEMS technologies where no active electronic devices, such as transistors or other integrated circuits are used. These technologies are the main areas of current MEMS systems. The other field of MEMS technologies is categorized as IC plus MEMS where active components are required. For MEMS and IC technologies, a challenge after the stand-alone MEMS technology has been validated is integration with active devices, for example, a circuit driver.

MEMS integration with a major supporting technology has been studied for over 20 years and some practical and proven solutions have been developed with commercial success, but are reaching limits with the main core of MEMS technology developments. Some industrially proven solutions can exist as two different categories such as 1) back end-of-line (BEOL) integration and 2) the IC processing and assembly as a dual flow system. In BEOL integration, standard IC processing as CMOS and/or BCD is applied and followed by back end-of-line MEMS processing. Typical applications can include printers and sensor arrays with various metal to chemical interactions, biometric sensors such as capacitance sensors and thermal sensors as non-limiting examples. In IC processing and assembly as a dual flow system, standard IC processing occurs typically followed by sawing and die preparation. MEMS processing and specific materials for a vacuum set up are applied where most mechanical related MEMS applications require vacuum and seeding. The dual die assembly can be arranged in a board or in stacked die solutions.

It would be advantageous to have MEMS preparation as a separate process flow and deliver an embedded MEMS substrate, such that MEMS wafers can be forwarded to other semiconductor fabricators for subsequent processing as a vendor wafer (or silicon wafer) with an embedded MEMS, allowing subsequent processing by an outside vendor. Thus, the MEMS substrate is a raw substrate for CMOS, BiCMOS, BCD or flash standard processing. The embedded MEMS substrate acts as a standard initial starting material for subsequent processing.

SUMMARY OF THE INVENTION

The embedded MEMS semiconductor substrate uses MEMS preparation and fabrication as a separate process flow. It includes MEMS release, vacuum realization and seeding followed by growing an epitaxial layer on the wafer such that an embedded MEMS substrate can be delivered ready for the standard processing as a standard initial material. MEMS processing can occur in various wafer sizes including 6, 8 and 12-inch wafer size as non-limiting examples with MEMS release and seeding and silicon capping. It is oxide released and vacuum compliant in a non-limiting example.

An embedded MEMS semiconductor substrate is used as a starting material for subsequent semiconductor device processing. A MEMS device is formed in a semiconductor substrate that includes at least one MEMS electrode and a buried silicon dioxide sacrificial layer used for releasing the MEMS. A planarizing layer is applied over the substrate, MEMS device and MEMS electrode. A polysilicon protection layer is applied over the planarizing layer. A silicon nitride capping layer is applied over the polysilicon protection layer. A polysilicon seed layer is applied over the silicon nitride capping layer. The MEMS device is released by removing at least a portion of the buried silicon dioxide sacrificial layer and an epitaxial layer is grown over the polysilicon seed layer to be used for subsequent semiconductor wafer processing.

In one aspect, the semiconductor wafer processing comprises one of CMOS, BiCHOS, BCD and NV memory processing. The buried oxide sacrificial layer could be removed by using hydrofluoric acid releasing. The planarizing layer can be removed by etching. The planarizing layer can be formed as a TEOS and spin-on-glass layer. The capping layer can be formed as a silicon nitride insulating layer. The MEMS device in one aspect is a resonator.

An electrode anchor can be formed to support at least the one MEMS electrode. Vias can be formed within the protection, nitride capping and seed layers for use in subsequent releasing of the MEMS device and implanting MEMS device and MEMS electrode contacts. The MEMS device and MEMS electrode can be isolated using trench isolation. An anchor can be formed to support the MEMS device contacts.

BRIEF DESCRIPTION OF THE DRAWINGS

Other objects, features and advantages of the present invention will become apparent from the detailed description of the invention which follows, when considered in light of the accompanying drawings in which.

FIG, 6 is a simplified cross-sectional view similar to FIGS. 1-5, but showing a sixth stage of formation in accordance with a non-limiting example.

Figure 5:
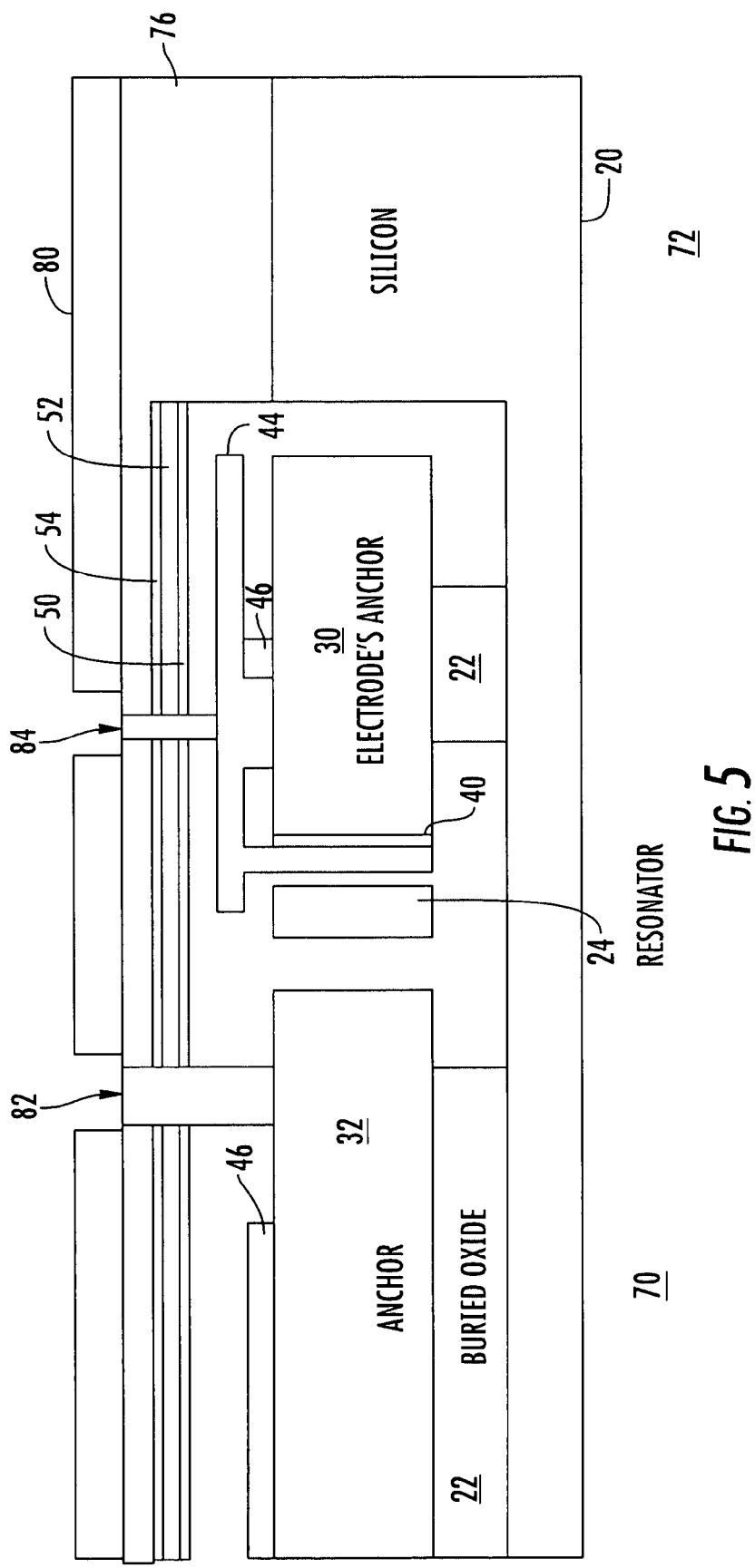
FIG. 5 is a simplified cross-sectional view similar to FIGS. 1-4, but showing a fifth stage of formation in accordance with a non-limiting example.
Figure 6:
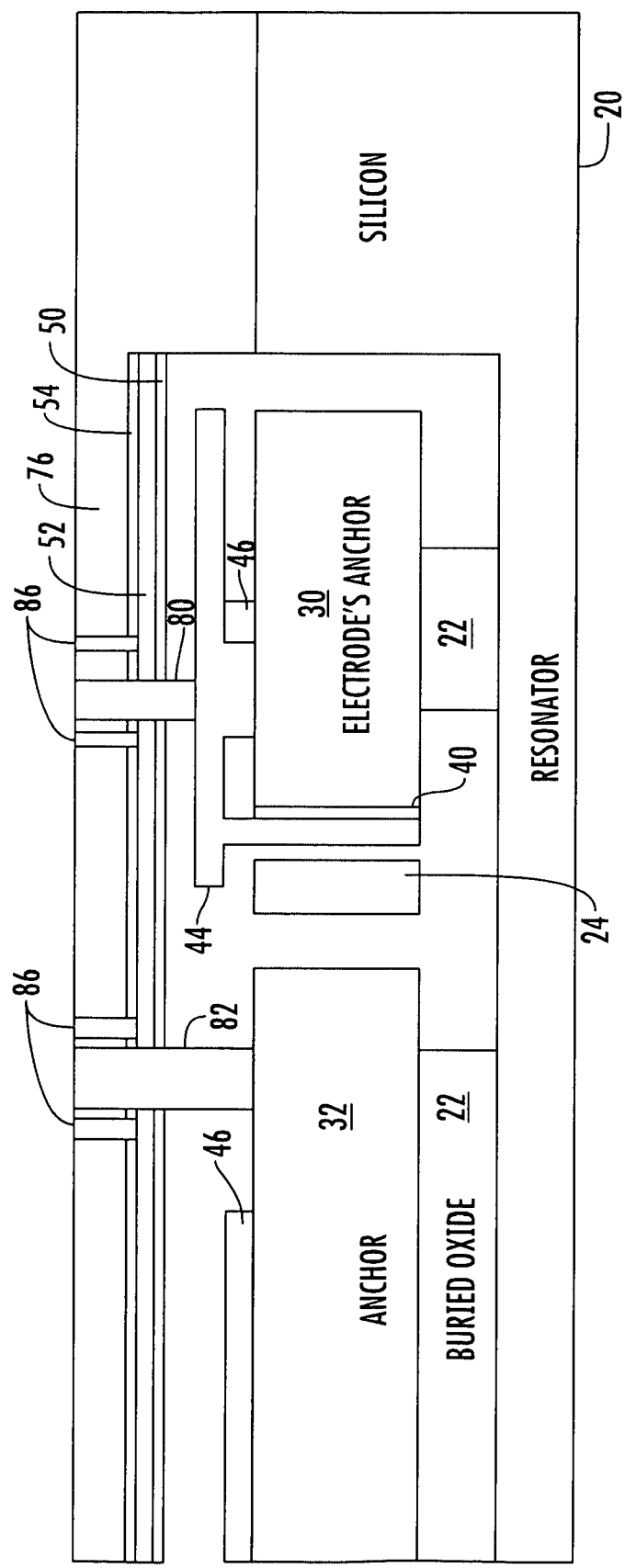
Figure 7:
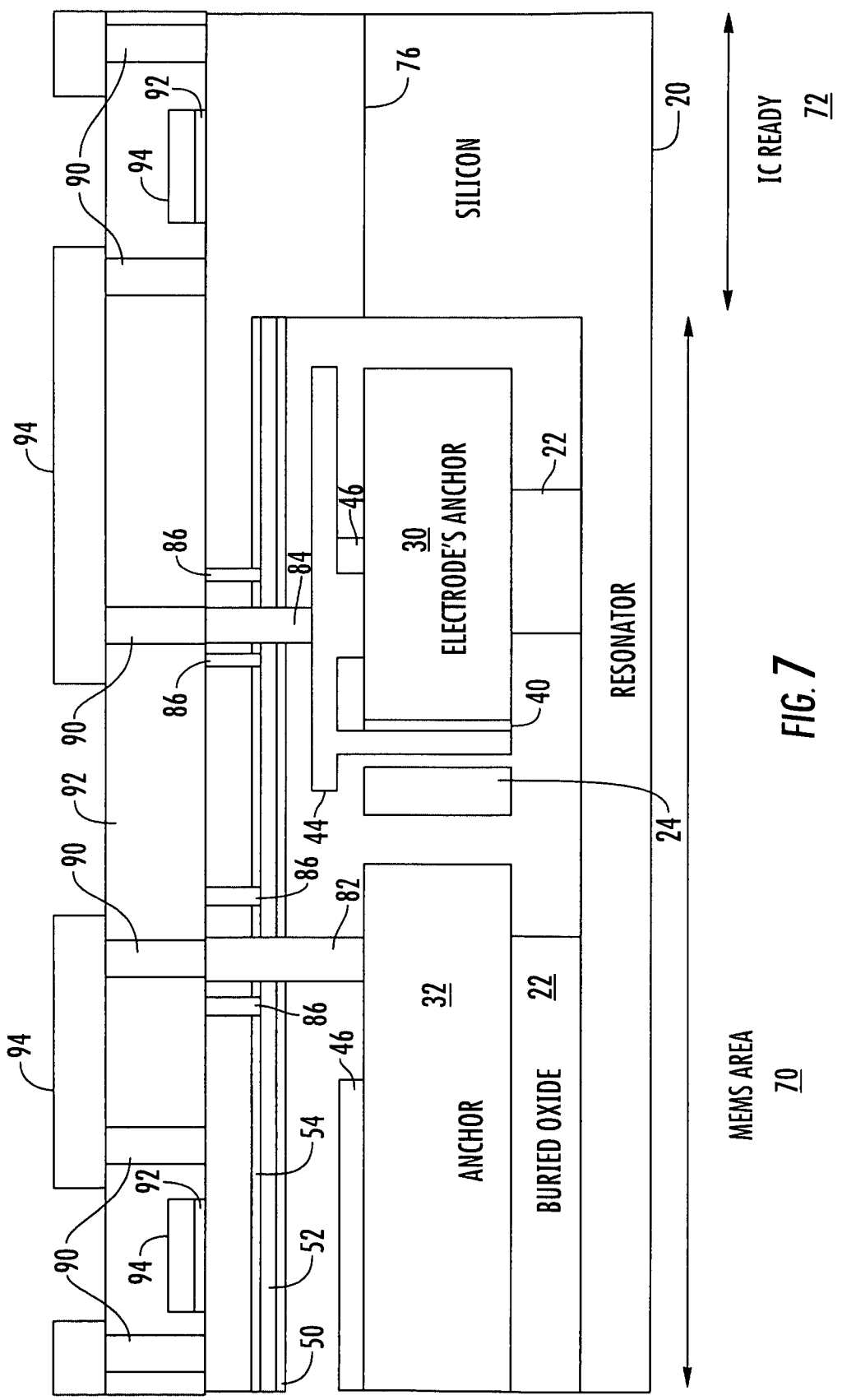

FIG. 7 is a simplified cross-sectional view similar to FIGS. 1-6, but showing a seventh stage of formation in accordance with a non-limiting example.

Figure 8:
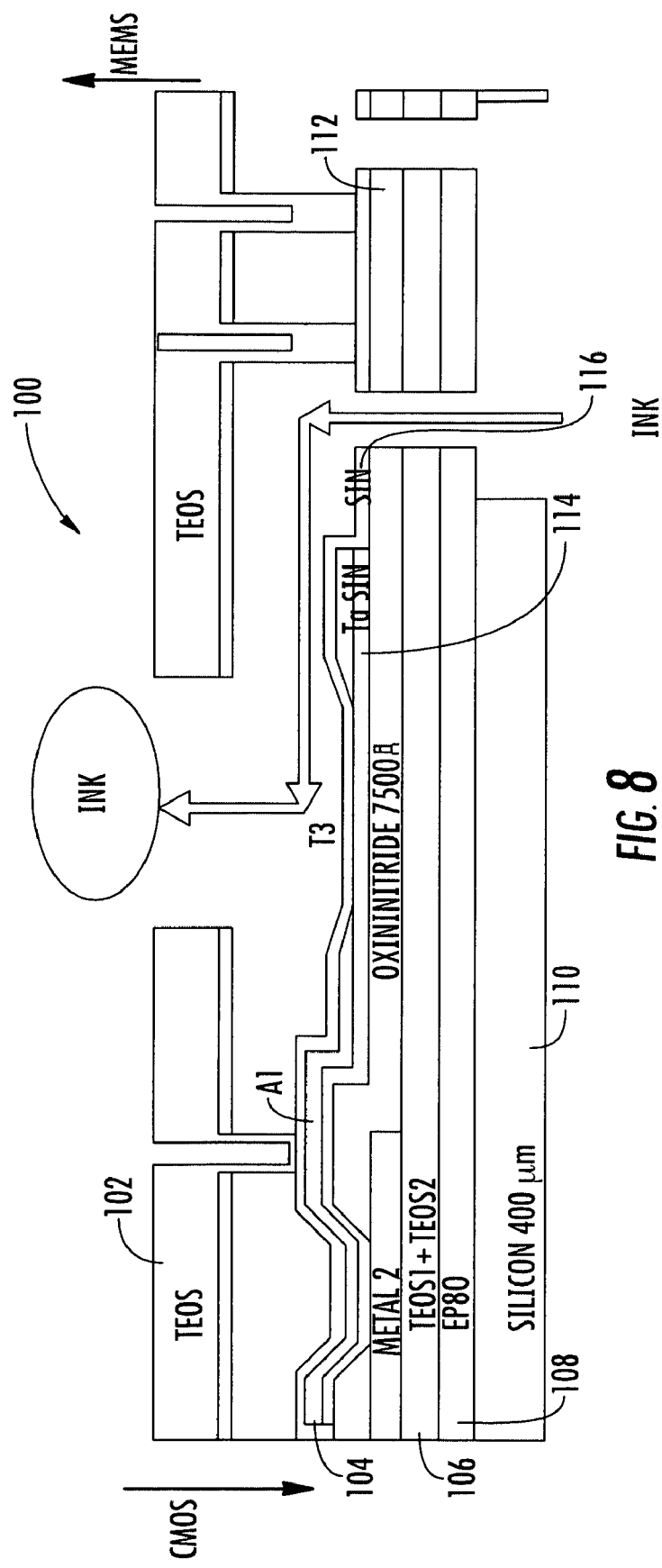

FIG. 8 is a simplified cross-sectional view of an embedded MEMS semiconductor substrate fabricated for MEMS ink movement IC multiplexing.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

FIGS. 1-7 are illustrative examples showing a sequence of processing steps used to form an embedded MEMS semiconductor substrate in accordance with a non-limiting example. This embedded MEMS can be used as a starting material for subsequent semiconductor device manufacturing such as CMOS, BiCMOS, BCD, or NV memory applications. The examples are shown with the process requirements used for manufacturing a silicon resonator as a MEMS device. A standard light MEMS resonator flow could have a silicon on oxide structure formed with a polysilicon "filling" for electrodes and an oxide (silicon dioxide) release for the resonator. The silicon on the oxide structure could be a 20-micrometer silicon layer thickness in non-limiting examples.

The light flow adaptation shown in FIGS. 1-7 could include a 20 micrometer silicon layer on oxide structure and a polysilicon "filling" for electrodes followed by an oxide "filling" and a polysilicon protection layer for hydrofluoric (HF) acid release. A silicon nitride capping layer can be used as an etch stop for subsequent silicon etching. A polysilicon seed layer can be used for epitaxial growth and used for standard integrated circuit (IC) processing, thus, forming the embedded MEMS semiconductor substrate useful as a starting material for subsequent semiconductor device manufacturing. It forms an integrated circuit (IC) ready chip. There can be a following flow with a mix of spin-on-glass (SOG) and standard areas for the IC ready silicon.

At a wafer level, the example shown in FIGS. 1-7 could have a contact-to-input electrode, a contact-to-output electrode, and a contact-to-resonator anchor. In this example, the final product is a ready-to-IC process MEMS having in this example the form of a silicon resonator that can be used for a large amount of standard circuits to deliver to markets the various circuits with an embedded clock.

The area used in the wafer depends on the specific schematics of the stand-alone MEMS. The embedded MEMS area can be used for the processing on the product and depending on the electrical needs of any supporting circuit, the embedded MEMS area can be dedicated to interconnect and not active devices. There are some specific examples such as a CMOS circuit on top of the MEMS where all the wafer surface can be used. An example of a resonator on a precise analog technology can have the surface of the resonator of about 0.2 mm$^2$ and a typical circuit surface area of about 10 mm$^2$. The area used for the embedded MEMS can be increased to give more flexibility to supporting circuit layout by not using the connections.

The embedded MEMS technology as will be described allows the development and manufacturing of MEMS technologies as a specific activity and the reuse of standard technologies, only changing the starting material and design rules while allowing a new spectrum of applications on MEMS and IC capabilities. Significant alternatives to IC and MEMS emerging applications are generally developed with a post processing methodology at an assembly level. The embedded MEMS substrate can allow various business opportunities that have not heretofore been allowed compared to the SOI business applications. The embedded silicon resonator as described can be extended to embedded mechanical sensors and a large spectrum of new applications as non-limiting examples.

Figure 1:
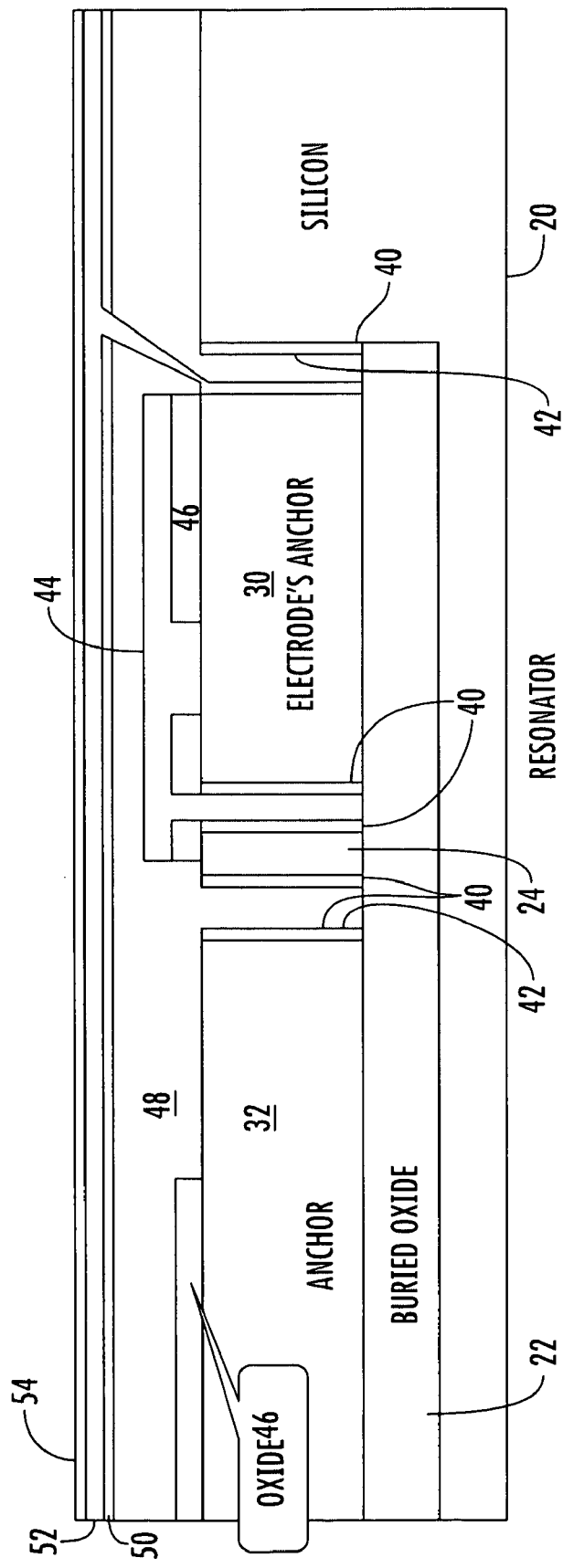
FIG. 1 is a simplified cross-sectional view of the embedded MEMS semiconductor substrate in a first stage of formation when the MEMS device has been formed in the semiconductor substrate and includes at least one MEMS electrode and a buried silicon dioxide (oxide) sacrificial layer used for releasing the MEMS and the applied planarizing, polysilicon protection and silicon nitride capping layer.

Referring now to FIG. 1, there is shown the simplified cross-sectional view of an embedded MEMS semiconductor substrate in a first stage of processing when the MEMS device as a resonator has been formed in the semiconductor, silicon substrate 20 known to those skilled in the art. A buried silicon dioxide layer 22 is formed as a sacrificial layer and labelled as the buried oxide layer as illustrated. The MEMS device is shown at 24 as a resonator and formed in the silicon substrate 20 and shown only diagrammatically as a resonator. Many different types of MEMS devices could be formed in the silicon substrate, including the resonator as illustrated. Other examples of MEMS devices include piezoelectric and thermal bubble printer ejectors, accelerometers, gyroscopes, silicon pressure sensors, display devices, optical switches and other similar devices. An electrode anchor is illustrated at 30 and another anchor as a MEMS device anchor is shown at 32 and positioned over the buried sacrificial layer 22. A thermal oxide 40 has been formed in previously fabricated trenches 42 to form the boundary for the electrode anchor 30 and the MEMS device anchor 32. A polysilicon MEMS electrode is illustrated at 44 and supported by an oxide layer 46. A planarizing layer 48 has been formed over the substrate 20, MEMS device 24 and MEMS electrode 44 and formed as a TEOS (tetraethyl orthosilicate) with a combined spin-on-glass (SOG) and TEOS layer that can include processing with chemical mechanical planarization (polishing).

As illustrated, a polysilicon protection layer 50 is applied as a deposit over the planarizing layer 48, which is followed by the application of a silicon nitride capping layer 52 over the polysilicon protection layer 50. This is followed by a polysilicon seed layer 54 over the silicon nitride capping layer 52. This top polysilicon seed layer 54, in one non-limiting aspect, can be about 0.5 um plus have a selectivity to hydrofluoric acid release.

Figure 2:
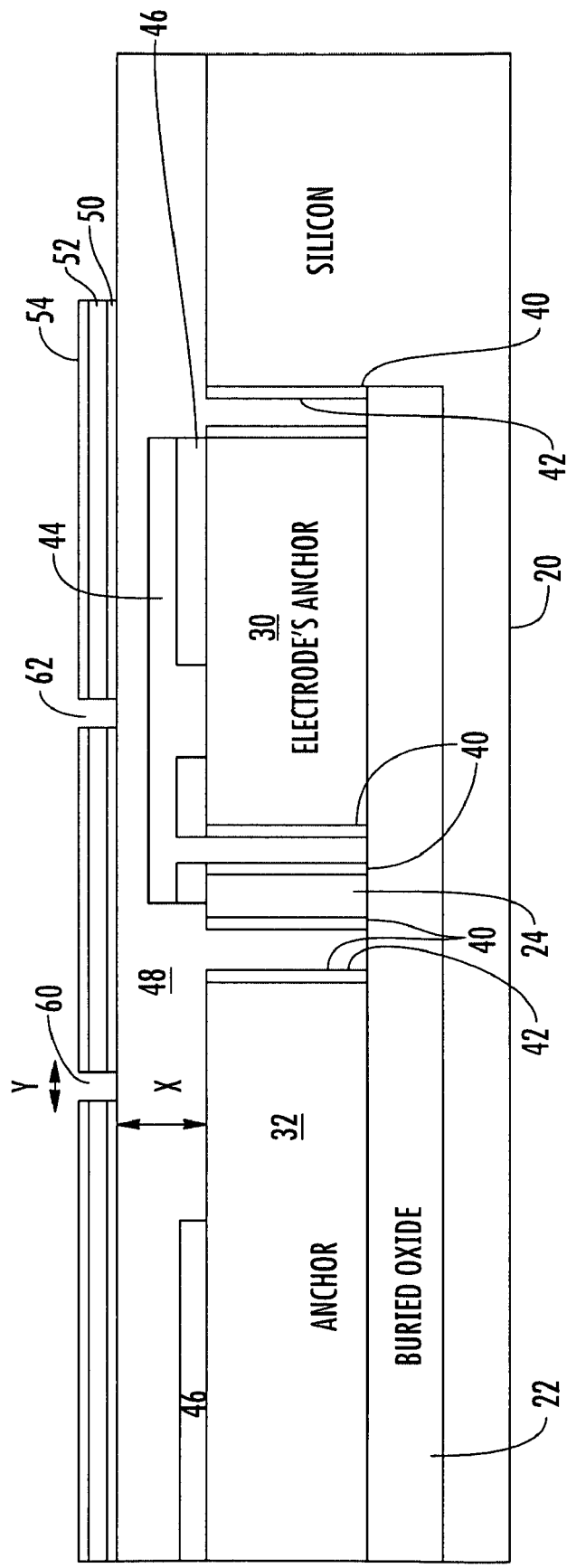
FIG. 2 is a simplified cross-sectional view similar to FIG. 1, but showing a second stage of formation in accordance with a non-limiting example.

As shown in FIG. 2, an openings (or vias) 60, 62 formed for oxide release and forming contacts. A fill/release material thickness corresponds to X and a contact/release dimension corresponds to Y. X can be less than Y if the release opening is going to be a contact opening and Y can be much less than X if the contact opening is done before the release opening.

Figure 3:
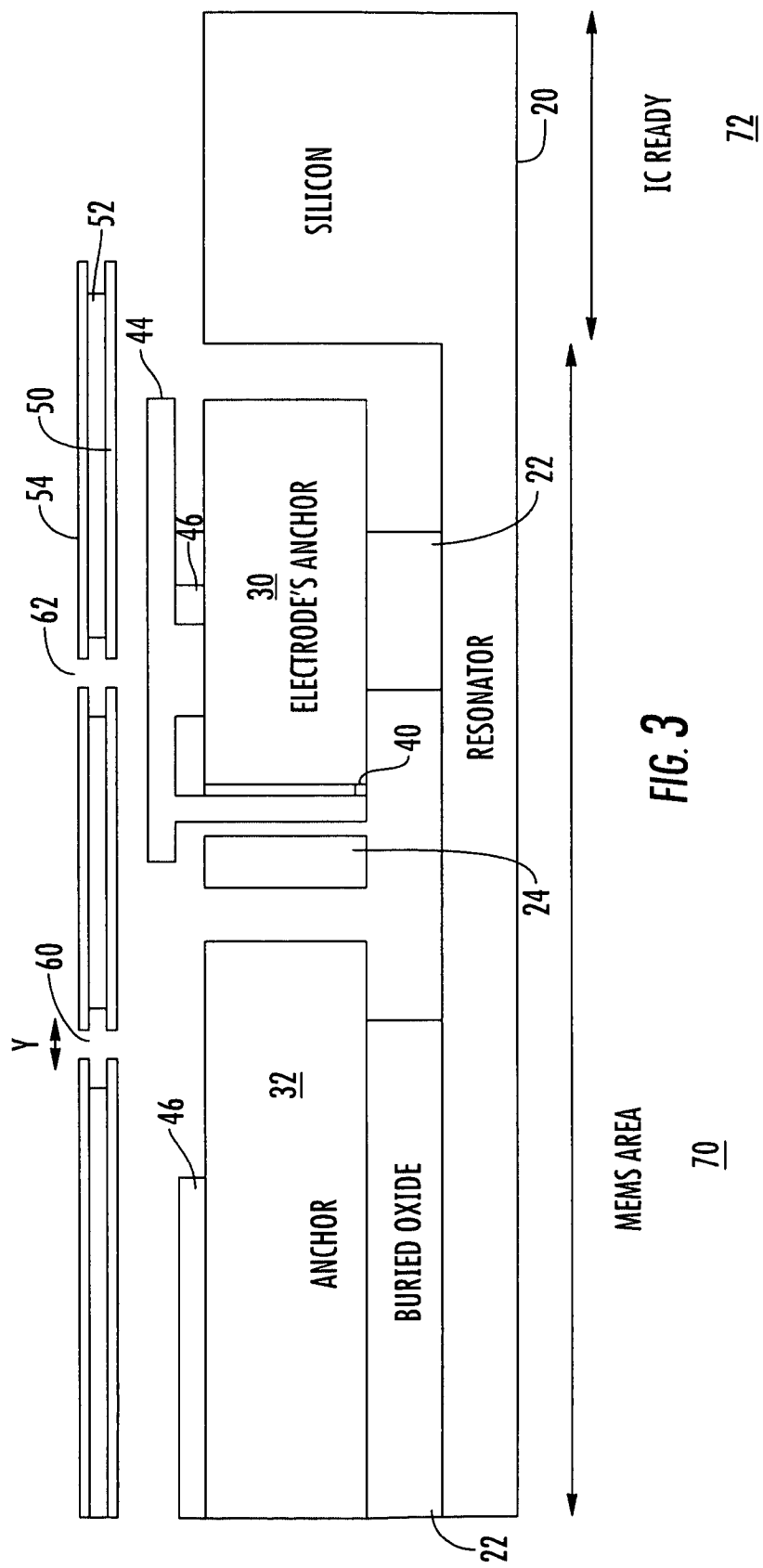
FIG. 3 is a simplified cross-sectional view similar to FIGS. 1 and 2, but showing a third stage of formation in accordance with a non-limiting example.

FIG. 3 shows the next stage in processing and illustrates the oxide release and cleaning and alloying (outgazing) in which the polysilicon layers 50, 54 are used to protect structures from the hydrofluoric acid etching. A dimension for Y is about 1 to 2 micrometers in one non-limiting example, and in case of a resonator, it is possible to dimension the flow contact to be around 6 micrometers. The MEMS area is shown at 70 and the IC ready area to be used for subsequent processing is shown at 72.

Figure 4:
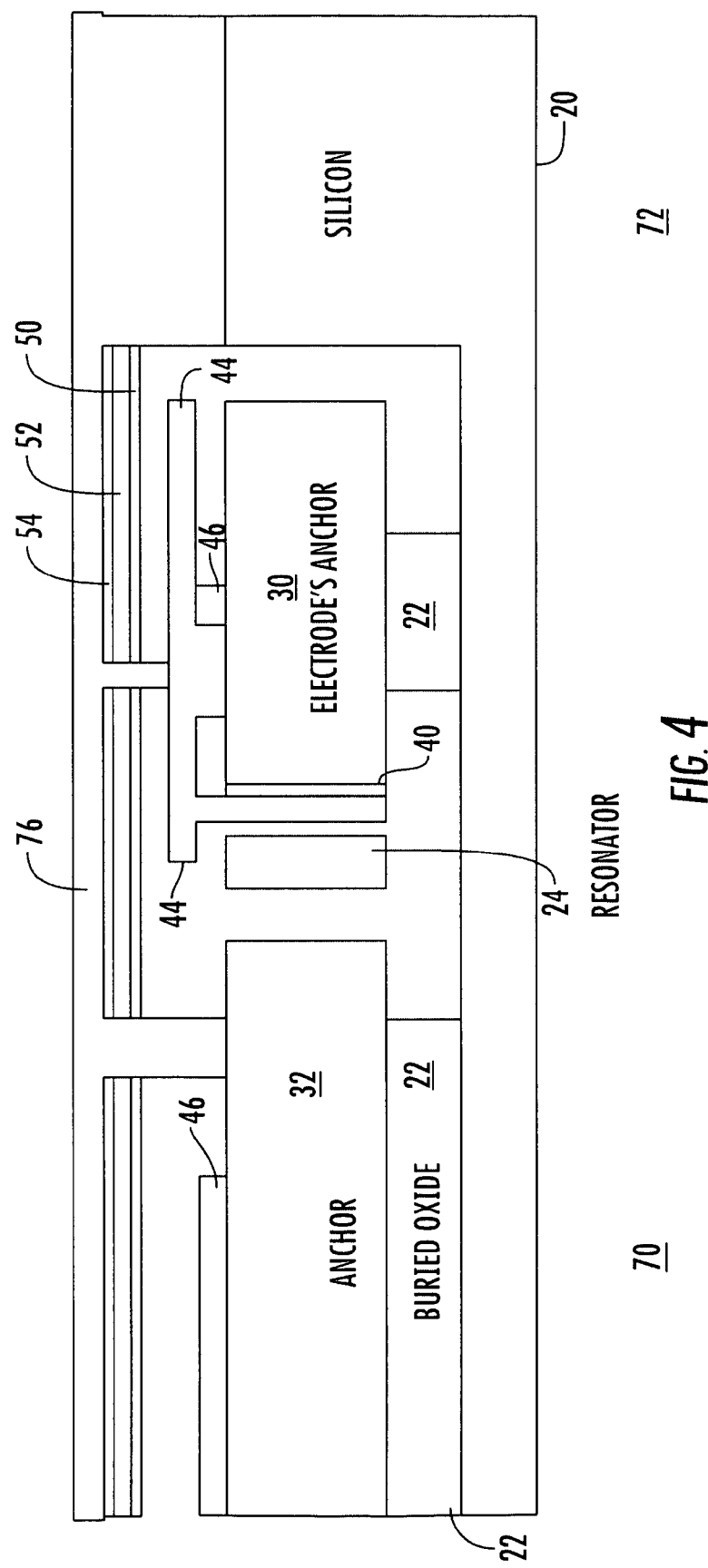
FIG. 4 is a simplified cross-sectional view similar to FIGS. 1-3, but showing a fourth stage of formation in accordance with a non-limiting example.

FIG. 4 shows a fourth stage of formation for vacuum-phase epitaxy in which the epitaxial layer is grown for hole seeding as indicated at 76. The vias 60, 62 for a MEMS device contact and a MEMS electrode contact have been filled as illustrated are shown in relative dimension to each other for purposes of illustration and showing that a MEMS device contact has the greater dimension in this non-limiting example.

FIG. 5 shows the fifth stage of processing in which the epitaxial layer 76 has been processed with chemical mechanical polishing (CMP) and planarization and photoresist layer 80 added for deep contact formation and implementation as illustrated with the addition of the MEMS device contact 82 and MEMS electrode contact 84. As illustrated, the MEMS device 24 has been released. The layer 80 is later removed.

FIG. 6 shows a sixth stage of processing in which trench isolation 86 of the MEMS device contact 82 and MEMS electrode contact 82 occurs after layer 80 has been removed. Trench isolation can occur by trench etching and trench "filling" with oxide and polysilicon chemical mechanical planarization (polishing).

FIG. 7 shows further processing with deep contacts 90 in added layers 92 added for subsequent semiconductor processing on the substrate and showing processing occurring on the entire substrate with various devices illustrated at 94 and connected by the contacts 90 to the substrate and other buried contacts and devices as shown.

FIG. 8 is an example of a MEMS ink movement and IC multiplexing structure 100 in which a MEMS is integrated at the BEOL. As illustrated, various layers include a TEOS layer 102, various metal layers 104 (including an Al layer), a TEOS 1 plus TEOS 2 layer 106, a BPSG layer 108 and a silicon 400 micrometer layer 110. Other layers include the Ox nitride 112 and Ta(x)Si(y)N(z) (TSIN) 114 and Si(x)N(y) (SIN) 116 layers. Ink movement is shown as illustrated.

Other applications for the process as described could be module integration by packaging including a MEMS microphone and IC amplifier adjacent to each other and a MEMS pressure sensor and IC amplifier with a membrane and air cavity with the MEMS integrated prior to the integrated circuit. Many other applications are possible. Typically, the process as described is not used with MEMS structures that require metal layers or precise implanted dopants because the thermal processing of IC's will require up to 100° C. processing temperature.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of forming an embedded MEMS semiconductor substrate used as a starting material for subsequent semiconductor device processing, comprising:
    forming a MEMS device in a semiconductor substrate that includes at least one MEMS electrode and a buried silicon dioxide sacrificial layer used for releasing the MEMS;
    applying a planarizing layer over the substrate, MEMS device and MEMS electrode;
    applying a polysilicon protection layer over the planarizing layer;
    applying a silicon nitride capping layer over the polysilicon protection layer;
    applying a polysilicon seed layer over the silicon nitride capping layer;
    releasing the MEMS device by removing at least a portion of the buried silicon dioxide sacrificial layer; and
    growing an epitaxial layer over the polysilicon seed layer to be used for subsequent semiconductor wafer processing.

2. The method according to claim 1, wherein the subsequent semiconductor wafer processing comprises one of CMOS, BiCMOS, BCD and NV memory processing.

3. The method according to claim 1, which further comprises removing the buried oxide sacrificial layer using hydrofluoric acid releasing.

4. The method according to claim 1, which further comprises removing the planarizing layer by etching.

5. The method according to claim 1, which further comprises forming the planarizing layer as a TEOS and spin-on-glass layer.

6. The method according to claim 1, which further comprises forming the capping layer as a silicon nitride insulating layer.

7. The method according to claim 1, which further comprises forming the MEMS device as a resonator.

8. The method according to claim 1, which further comprises forming an electrode anchor supporting the at least one MEMS electrode.

9. The method according to claim 8, which further comprises forming an anchor to isolate the MEMS device.

10. The method according to claim 1, which further comprises forming vias within the protection, nitride capping and seed layers for use in subsequent releasing of the MEMS device and implanting MEMS device and MEMS electrode contacts.

11. The method according to claim 1, which further comprises isolating any MEMS device and MEMS electrode contacts using trench isolation.

12. The method according to claim 1, which further comprises removing the planarizing layer before growing an epitaxial layer.

13. A method of forming an embedded MEMS semiconductor substrate used as a starting material for subsequent semiconductor device processing, comprising:
    forming a MEMS device in a semiconductor substrate and at least one MEMS electrode and which includes a buried silicon dioxide sacrificial layer;
    releasing the MEMS device by removing the buried sacrificial layer and applying a polysilicon seed layer and capping layer over the MEMS device and at least one MEMS electrode while also forming vias using photolithography and implanting deep contacts to the MEMS device and any MEMS electrodes and forming trench isolation of such deep contacts; and growing an epitaxial layer over the polysilicon seed layer to be used for subsequent semiconductor wafer processing.

14. The method according to claim 13, wherein the subsequent semiconductor wafer processing comprises one of CMOS, BiCMOS, BCD and NV memory processing.

15. The method according to claim 14, and further comprising the step of applying planarizing and capping layers over the substrate, MEMS device and MEMS electrode before releasing the MEMS device.

16. The method according to claim 15, which further comprises forming the planarizing layer as a TEOS and spin-on-glass layer.

17. The method according to claim 13, which further comprises removing the buried oxide sacrificial layer using hydrofluoric acid releasing.

18. The method according to claim 13, which further comprises forming the MEMS device as a resonator.

19. The method according to claim 13, which further comprises isolating any MEMS device and MEMS electrode contacts using trench isolation.

* * * * *